(12) United States Patent
Mathew et al.

(10) Patent No.: US 9,431,313 B1
(45) Date of Patent: Aug. 30, 2016

(54) INTEGRATED CIRCUIT CARRIER COATING

(71) Applicant: FREESCALE SEMICONDUCTOR, INC., Austin, TX (US)

(72) Inventors: Varughese Mathew, Austin, TX (US); Thomas H. Koschmieder, Austin, TX (US)

(73) Assignee: Freescale Semiconductor, Inc., Ausin, TX (US)

(*) Notice: Subject to any disclaimer, the term of this patent is extended or adjusted under 35 U.S.C. 154(b) by 0 days.

(21) Appl. No.: 14/626,242

(22) Filed: Feb. 19, 2015

(51) Int. Cl.
*H01L 23/26* (2006.01)
*H01L 23/31* (2006.01)
*H01L 23/498* (2006.01)
*H01L 21/48* (2006.01)
*H05K 1/18* (2006.01)

(52) U.S. Cl.
CPC ........... *H01L 23/26* (2013.01); *H01L 21/4846* (2013.01); *H01L 23/3114* (2013.01); *H01L 23/49894* (2013.01); *H05K 1/181* (2013.01)

(58) Field of Classification Search
None
See application file for complete search history.

(56) References Cited

U.S. PATENT DOCUMENTS

| | | | |
|---|---|---|---|
| 7,371,331 B2 | 5/2008 | Marty et al. | |
| 8,432,036 B2 * | 4/2013 | Hanson | H01L 23/49558 257/666 |
| 8,656,582 B2 | 2/2014 | Lee et al. | |
| 9,017,822 B2 * | 4/2015 | Fukunaga | B29C 39/10 257/788 |

2009/0302460 A1   12/2009   Nnebe

OTHER PUBLICATIONS

Wong, C.K.Y., et. al., "A New Approach in Measuring Cu-EMC Adhesion Strength by AFM", IEEE Transactions on Components and Packaging Technologies, vol. 29, No. 3, Sep. 2006, pp. 543-550.*
J. Denayer, J. Delhalle, Z. Mekhalif, "Aminealkylthiol and dithiol self-assembly as adhesion promoter between copper substrate and epoxy resin." Applied Surface Science, vol. 257, Issue 24, Oct. 1, 2011, pp. 10686-10691.*
Wilde J., Lecture Notes for Assembly and Package Technology 2012/13, IMTEK, University of Freiburg.*
Self-Assembled Monolayers Related Reagents, Alkanethiol Derivative, Dojindo, downloaded from URL<http://www.dojindo.com/Shared/Protocol/SAM_Protocol.pdf> on Jan. 13, 2016.*
Dibenedetto et al, "Molecular Self-Assembled Monolayers and Multilayers for Organic and Unconventional Inorganic Thin-Film Transistor Applications", Advanced Materials, Apr. 20, 2009, pp. 1407-1433, vol. 21, Issue 14-15.
Mrksich et al, "Using Microcontact Printing to Pattern the Attachment of Mammalian Cells to Self-Assembled Monolayers of Alkanethiolates on Transparent Films of Gold and Silver", Experimental Cell Research, Sep. 15, 1997, pp. 305-313.
Ulman, "Formation and Structure of Self-Assembled Monolayers", Chemical Reviews, 1996, pp. 1533-1554, vol. 96, No. 4, Brooklyn, New York.
Love et al, "Self-Assembled Monolayers of Thiolates on Metals as a Form of Nanotechnology", Chemical Reviews, 2005, pp. 1103-1169, vol. 105, No. 4.

(Continued)

*Primary Examiner* — Joseph Schoenholtz

(57) ABSTRACT

A device includes an integrated circuit (IC) carrier for a semiconductor device, and a coating on the IC carrier. In the presence of an electrical field or a magnetic field, the coating includes a first functional group that attracts anions and a second functional group that attracts cations.

20 Claims, 3 Drawing Sheets

(56) References Cited

OTHER PUBLICATIONS

Chandekar et al, "Thermal stability of thiol and silane monolayers: A comparative study", Applied Surface Science, 2010, pp. 2742-2749.

Turchanin et al, "High thermal stability of cross-linked aromatic self-assembled monolayers: Nanopatterning via selective thermal desorption", Applied Physics Letters, Jan. 2007, pp. 053102-053102-3, vol. 90, Issue 5, AIP.

* cited by examiner

INTEGRATED CIRCUIT CARRIER COATING

FIELD

This disclosure relates generally to integrated circuit carriers, and more specifically, to coating metal contacts of an integrated circuit carrier.

RELATED ART

Packaged semiconductor devices often include encapsulant materials that surround and protect a die. However, the encapsulant materials often include contaminants due to impurities introduced during the encapsulant processing. The contaminants location changes due to temperature and voltage excursions caused during operation of the packaged semiconductor device over time.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
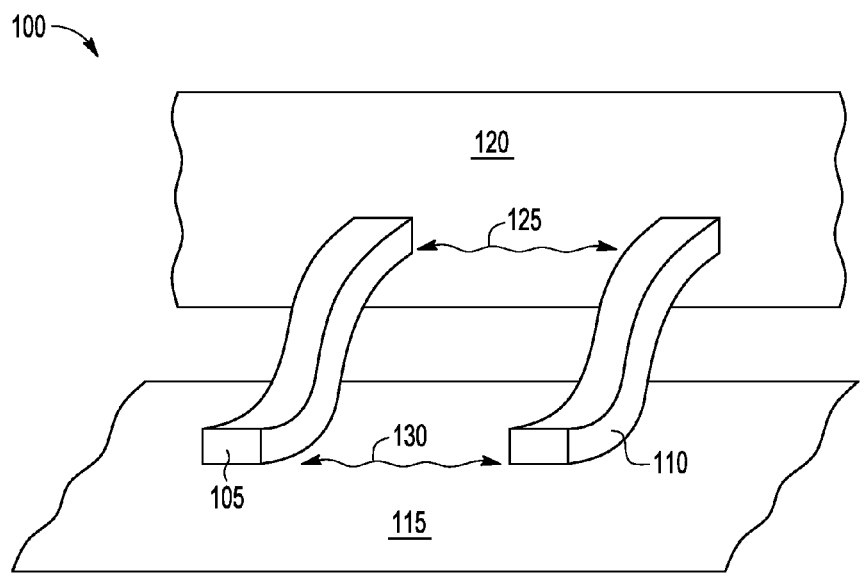
FIG. 1-3 illustrate block diagrams depicting example packaged semiconductor devices in which the disclosure is implemented, according to some embodiments.

The following sets forth a detailed description of various embodiments intended to be illustrative of the invention and should not be taken to be limiting.

Overview

A packaged semiconductor device often includes an encapsulant formed around a package substrate to protect a die attached to the package substrate. Encapsulants, such as mold compounds, contain some level of impurities or contaminants, such as chloride, sodium, ammonium, organic contaminants, and the like. These contaminants taint the encapsulant during package processing or result from the breakdown of encapsulant material, often due to increased temperature experienced by the encapsulant over time during operation of the packaged semiconductor device. These contaminants are mobile ionic species that include cations (positively charged ions) and anions (negatively charged ions).

A packaged semiconductor device also includes metal contacts (such as leads of a lead frame) that are closely spaced (e.g., the contacts may be separated by a spacing of less than 0.1 mm) in order to maximize the number of metal contacts. The metal contacts extend from the package substrate through the encapsulant. The surface of the encapsulant and the ends of the metal contacts are exposed to the ambient environment, which often includes exposure to moisture.

During operation of the packaged semiconductor device, an electromagnetic field (e.g., an electric field or a magnetic field or both) is produced by the packaged semiconductor device and extends through the encapsulant and metal contacts. At the encapsulant surface where moisture is present, the electromagnetic field causes the mobile ionic species (or ionic contaminants) to migrate towards metal contacts of opposite charge. The movement of the ionic contaminants at the surface of the encapsulant also affects the adjacent metal ions of the metal contacts, causing the metal ions to begin migrating. The metal ions migrate from one metal contact toward an oppositely charged metal contact and form dendrite-type metal growth along the encapsulant surface. The metal growth results in an increase in leakage current between the metal contacts, where the metal growth may even fully reach from one metal contact to another and form an electrical short between the metal contacts. Such ionic migration is often exacerbated due to tight spacing of metal contacts, which increases the voltage gradient present between the metal contacts, and in turn affects the electromagnetic field. Ionic migration often becomes critical when the packaged semiconductor device has a high operating voltage (e.g., 40V or higher).

The present disclosure provides a coating of a functionalized self-assembled monolayer (SAM) material that includes one or more functional groups selected to chemically bond to one or more targeted ions (e.g., one or more cations, one or more anions, or one or more of both cations and anions). The SAM material coats the metal contacts of a packaged semiconductor device in a region of the metal contacts adjacent to a surface of the encapsulant. In some embodiments, the SAM material also coats the entirety of the metal contacts, including over the tips of the metal contacts and under the encapsulant. In some embodiments, the SAM material also coats a package substrate and metal contacts within the packaged semiconductor device, including under the encapsulant. In some embodiments, the SAM material also coats the outside of the packaged semiconductor device, including over the encapsulant. The functionalized SAM material captures and immobilizes the targeted ions when an electromagnetic field is present, which prevents the targeted ions from influencing movement of metal ions of the metal contacts at the surface of the encapsulant. In this manner, metal growth between metal contacts due to such ionic migration is also reduced, which in turn reduces leakage current. In embodiments where the SAM material coats metal contacts within the packaged semiconductor device, including under the encapsulant, the SAM material also captures and immobilizes targeted ions that may migrate within the bulk of the encapsulant toward the metal contacts, which also prevents the targeted ions from influencing movement of metal ions of the metal contacts within the bulk of the encapsulant.

Example Embodiments

FIG. 1 illustrates a block diagram of an example packaged semiconductor device 100 in which the disclosure is implemented. Packaged semiconductor device 100 includes a package substrate having metal contacts 105 and 110, where one or more integrated circuits are attached to the package substrate (not shown). Packaged semiconductor device 100 also includes an encapsulant surrounding the package substrate and the one or more integrated circuits, where surface 120 is the external surface of the encapsulant. The encapsulant includes one or more layers of encapsulant materials. Examples of encapsulant materials include, but are not limited to, mold compound, epoxy, underfill, glob top, dam and fill, and the like. Examples of an integrated circuit include, but are not limited to, an integrated circuit die, a semiconductor die including a semiconductor substrate, a flip chip die, a sensor die, a passive component such as a resistor, a capacitor, an inductor, an oscillator, a battery, and the like, a sensor device, and the like. Examples of attachment mechanisms for the one or more integrated circuits to the package substrate include, but are not limited to, die attachment material, flip-chip bumps or pillars, conductive adhesive, and the like.

The package substrate has a number of metal contacts, such as metal contacts 105 and 110, which extend beyond surface 120 of the encapsulant. Packaged semiconductor device 100 also includes a chip carrier, where the package substrate is attached to a surface 115 of the chip carrier. Metal contacts of the package substrate are bonded or soldered to metal contacts of the chip carrier to form electrical connections between the package substrate and the chip carrier. The metal contacts of the package substrate, such as metal contacts 105 and 110, and the chip carrier include conductive metal. Examples of a conductive metal include, but are not limited to, copper, gold, and silver, which may also be plated by other conductive metals. Examples of plating metals include, but are not limited to, electroplating of copper, tin, silver, nickel, palladium, gold, and the like, and electroless plating of copper, nickel, palladium, gold, and the like. Other examples of a packaged semiconductor device are further discussed below in connection with FIGS. 2 and 3.

During operation of packaged semiconductor device 100, an electromagnetic field is produced by the packaged semiconductor device and is present in (or is applied to) the encapsulant and metal contacts, where the electromagnetic field includes an electric field, a magnetic field, or both. The applied electromagnetic field may be a constant field or an alternating field (e.g., radio wave fields). Typical ionic migration paths between metal contacts 105 and 110 are illustrated as arrow 125 along surface 120 and arrow 130 along surface 115. The direction of ionic migration depends upon the polarity of the ions present on surface 120 and surface 115 and the polarity of metal contacts 105 and 110.

In order to reduce ionic migration of the metal contacts at the surface of the encapsulant, the metal contacts (such as metal contacts 105 and 110) are coated with a functionalized self-assembled monolayer (SAM) material (also simply referred to as SAM material) that includes one or more functional groups capable of attracting and capturing one or more targeted ions, such as the cations or anions of the ionic contaminants that are present on the surface of the encapsulant. Each functional group carries a charge and attracts a targeted ion having opposite polarity. The targeted ion chemically bonds with the functional group, which immobilizes the targeted ion. While ionic contaminants may migrate along surface 120 of the encapsulant in the presence of moisture from the ambient environment and the applied electromagnetic field, the SAM material prevents such ionic contaminants from influencing movement of metal ions of the metal contacts. Also, ionic contaminants may migrate within the bulk of the encapsulant, in which case the SAM material coated on a metal contact within the encapsulant (or within the packaged semiconductor device) also prevents such ionic contaminants from influencing movement of metal ions of the metal contact. Example functional groups of SAM material are further discussed below in connection with FIGS. 4 and 5.

The chip carrier may also include encapsulant or insulation materials that similarly experience increased temperature over time during operation of the packaged semiconductor device, which causes such encapsulant or insulation materials to also break down and form ionic contaminants. Such ionic contaminants at the surface 115 of the chip carrier would also be exposed to moisture from the ambient environment and would be in the presence of the electromagnetic field produced by the packaged semiconductor device, giving rise to ionic migration along the surface of the chip carrier. In some embodiments, the SAM material is also applied to metal contacts of the chip carrier to reduce ionic migration of the metal contacts at the surface of the chip carrier's encapsulant or insulation materials.

It is noted that coating the metal contacts of the chip carrier and of the package substrate with the SAM material does not negatively affect the electrical connections formed on such coated metal contacts. The SAM material is effectively destroyed or removed during the soldering or bonding process, resulting in a reliable electrical connection.

Since metal contacts of both package substrate and chip carrier may be coated with the SAM material, the term integrated circuit (IC) carrier is used herein to describe a mounting structure to which an integrated circuit is mounted or attached, where an IC carrier includes both package substrates and chip carriers.

In some embodiments, each metal contact is coated with the SAM material at least in a region of the metal contact adjacent to a surface of the encapsulant (e.g., where the metal contact and encapsulant surface meet or are in contact with one another). In some embodiments, each metal contact is coated with the SAM material at least in a region of the metal contact under the surface of the encapsulant (e.g., in a region that would otherwise be in contact with the encapsulant). In some embodiments, each metal contact of an IC carrier is coated with the SAM material over the entirety of the metal contact, including under the encapsulant and over the tips of the metal contact. In some embodiments, the entire IC carrier including metal contacts is coated with the SAM material. In embodiments where the IC carrier is formed as part of an array (e.g., a lead frame array), the array is coated with SAM material before singulation, where each IC carrier may receive subsequent applications of SAM material after singulation. In other embodiments, the IC carrier is coated with SAM material after singulation.

In some embodiments, the entire packaged semiconductor device 100 is coated with the SAM material, where the packaged semiconductor device includes an IC carrier that in turn includes a package substrate, a chip carrier, or both. In such further embodiments, SAM material coats an external surface of packaged semiconductor device 100, including over an external surface of the encapsulant and over an external surface of the metal contacts of the IC carrier (which is a package substrate or a chip carrier or both). Accordingly, in the various embodiments described, the SAM material may be coated within packaged semiconductor device 100 (e.g., on metal contacts of package substrate or chip carrier, package substrate itself, chip carrier itself), coated outside of packaged semiconductor device 100 (e.g., on metal contacts of package substrate or chip carrier, encapsulant), or both.

Examples of coating the metal contacts with the SAM material includes, but is not limited to, dipping the metal contacts of the IC carrier into SAM material, immersing the entire IC carrier into SAM material, spraying the SAM material onto the metal contacts or onto the entire IC carrier, applying the SAM material onto the metal contacts or portions of the IC carrier through photomask openings (e.g., for precision application), and the like.

Examples of an IC carrier include, but are not limited to, organic chip carriers, ceramic chip carriers, a printed circuit board (PCB), a leadframe, a quad flat no lead (QFN) package substrate, a power QFN package substrate, a ball grid array (BGA) package substrate, a micro leadframe, a small outline leadframe, a thin small outline package substrate, a zig-zag inline package substrate, a single inline package substrate, a dual inline package substrate, a flatpack substrate, a land grid array (LGA) package substrate, a pin grid array package substrate, a plastic leaded chip carrier, a chip scale package substrate, a flip chip package substrate, a package on package, quilt packaging, and other similar package substrates.

Figure 2:
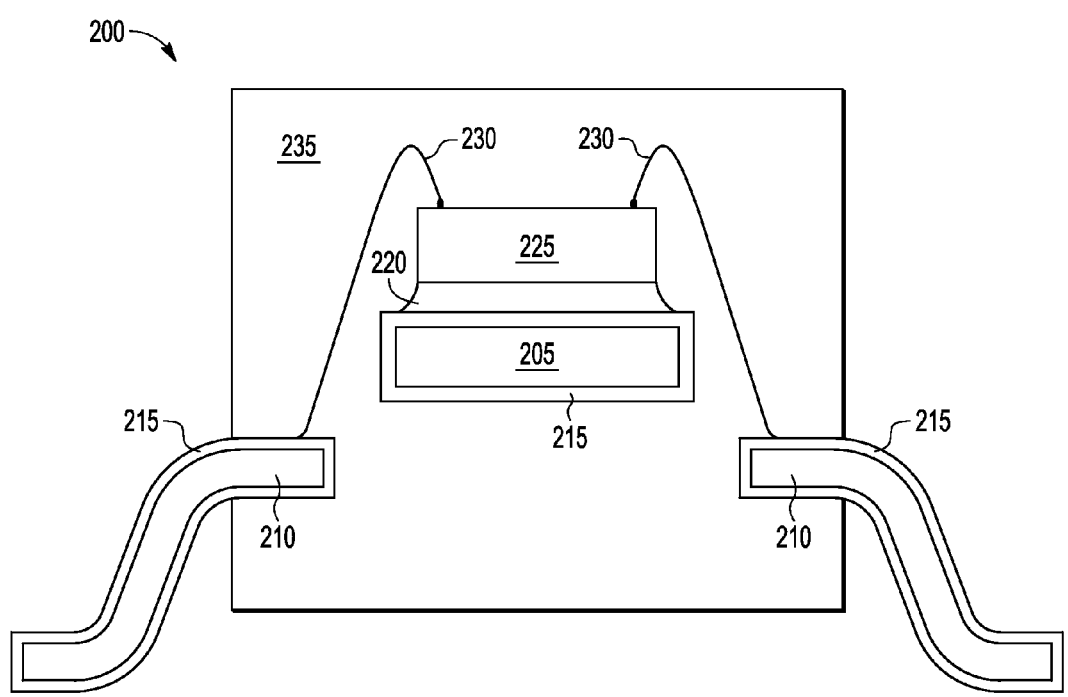

FIG. 2 illustrates a block diagram depicting an example packaged semiconductor device 200 that includes an IC carrier. In the embodiment illustrated, the IC carrier is a leadframe having a flag portion 205 and leads 210, where a layer of SAM material 215 coats or covers the leadframe in its entirety, including over the tips of leads 210. The coverage shown in FIG. 2 is achieved in some embodiments by singulating the leadframe from an array of leadframes and coating the leadframe, including over tips of leads 210, with SAM material 215. Such coverage is also achieved in other embodiments by coating an array of leadframes with the SAM material 215 and applying an additional layer of SAM material 215 to the tips of leads 210 that are exposed after singulation.

Packaged semiconductor device 200 includes an integrated circuit 225 (e.g., an integrated circuit die) that is attached to flag portion 205 of the leadframe with attachment material 220 (e.g., die attach material). For clarity, a single integrated circuit configuration is shown in FIG. 2. Packaged semiconductor device 200 also includes wire bonds 230 between integrated circuit 225 and contact pads on leads 210, which form electrical connections between the integrated circuit and the leadframe. Integrated circuit 225, wire bonds 230, flag portion 205, and portions of leads 210 are surrounded by encapsulant 235.

It is noted that the coverage of the IC carrier shown in FIG. 2 is beneficial because the SAM material 215 is present between each lead 210 and encapsulant 235 at the encapsulant surface in order to capture targeted ions at the encapsulant surface. In other words, the layer of SAM material 215 is formed around each lead 210 in the region where lead 210 would otherwise be in contact with the encapsulant surface. SAM material 215 effectively forms an ionic migration barrier that reduces direct exposure of the metal ions of leads 210 to movement of the ionic contaminants at the encapsulant surface. Such coverage is achieved in embodiments where the IC carrier is coated with SAM material 215 at a time prior to formation of encapsulant 235 around the IC carrier.

In other embodiments, the packaged semiconductor device 200 is coated with SAM material 215 at a time after encapsulant 235 is formed around the IC carrier. In such embodiments, the SAM material 215 is applied to external surfaces of packaged semiconductor device 200, including (external) surfaces of leads 210 and surfaces of encapsulant 235. Such embodiments are also beneficial because the SAM material 215 is still formed around a portion of each lead 210 at the encapsulant surface and is still able to capture targeted ions on the encapsulant surface and reduce direct exposure of the metal ions of leads 210 to movement of the ionic contaminants at the encapsulant surface. Since the external surface of the encapsulant is also coated with SAM material, the SAM material is able to immobilize a greater number of targeted ions along the encapsulant surface, further reducing the movement of ionic contaminants before they are able to reach the vicinity of leads 210. In some embodiments, SAM material 215 is present between each lead 210 and encapsulant 235 at the encapsulant surface, as well as over the encapsulant surface.

Figure 3:
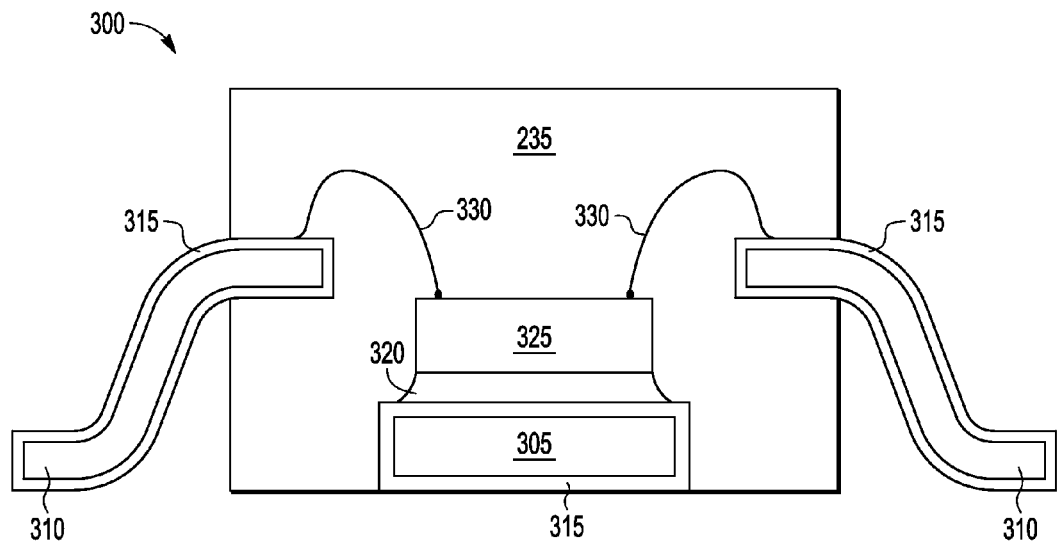

FIG. 3 illustrates a block diagram depicting an example packaged semiconductor device 300 that includes an IC carrier. In the embodiment illustrated, the IC carrier is a leadframe having a pad 305 and leads 310, where a layer of SAM material 315 coats or covers the leadframe in its entirety, including over the tips of leads 310. The coverage shown in FIG. 3 is achieved in similar embodiments described above in connection with FIG. 2.

Packaged semiconductor device 300 includes an integrated circuit 325 that is attached to pad 305 with attachment material 320. For clarity, a single integrated circuit configuration is shown in FIG. 3. Packaged semiconductor device 300 also includes wire bonds 330 between integrated circuit 325 and contact pads on leads 310, which form electrical connections between the integrated circuit and the leadframe. Integrated circuit 325, wire bonds 330, an upper portion of pad 305, and portions of leads 310 are surrounded by encapsulant 235. A bottom surface of pad 305 is not covered by encapsulant 235, which makes pad 305 an "exposed" pad 305.

It is noted that the coverage of the IC carrier shown in FIG. 3 is additionally beneficial because the SAM material 315 is also present over the leads 310 and the exposed pad 305 and under the encapsulant 235 at the encapsulant surface in order to capture targeted ions at the encapsulant surface. In other words, the layer of SAM material 315 is formed around the leads 310 and pad 305 in the region where leads 310 and pad 305 would otherwise be in contact with the encapsulant surface. SAM material 315 effectively forms an ionic migration barrier that reduces direct exposure of the metal ions of leads 310 and pad 305 to movement of the ionic contaminants at the encapsulant surface. Such coverage is achieved in embodiments where the IC carrier is coated with SAM material 315 at a time prior to formation of encapsulant 235 around the IC carrier.

In other embodiments, packaged semiconductor device 300 is coated with SAM material 315 at a time after encapsulant 235 is formed around the IC carrier. In such embodiments, the SAM material 315 is applied to external surfaces of packaged semiconductor device 300, including over (external) surfaces of leads 310, exposed pad 305, and encapsulant 235. Such embodiments are also beneficial because the SAM material 315 is still formed around a portion of each lead 310 and pad 305 at the encapsulant surface, where the SAM material 315 is still able to capture targeted ions on the encapsulant surface. SAM material 315 is able to immobilize a greater number of targeted ions before they are able to reach the vicinity of leads 310 and pad 305, which reduces direct exposure of the metal ions of leads 310 and pad 305 to movement of the ionic contaminants at the encapsulant surface.

Figure 4:
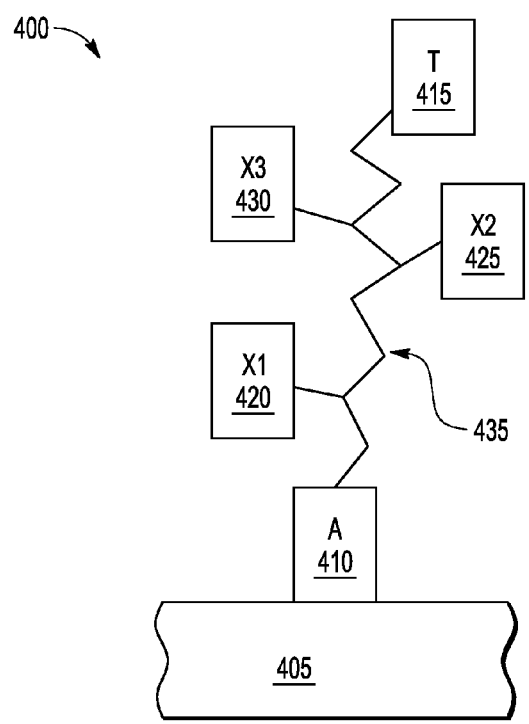
FIG. 4-5 illustrate block diagrams depicting example molecules of a functionalized self-assembled monolayer (SAM) material in which the disclosure is implemented, according to some embodiments.

FIG. 4 illustrates a block diagram depicting an example molecule of a functionalized self-assembled monolayer (SAM) material 400. A self-assembled monolayer (SAM) material includes a single layer of molecules, where each molecule assembles itself or forms spontaneously. In the embodiment illustrated, SAM material 400 includes a single type of molecular assembly that incorporates one or more functional groups, which are short molecules that are capable of attracting and capturing a particular type of ion, such as a cation or an anion, of an ionic contaminant that is expected or known to be present on the encapsulant surface.

The molecular assembly of SAM material 400 (also referred to as a SAM molecule 400) includes an anchoring element A 410 that has an affinity for and is capable of attaching to a metal surface 405. An example anchoring element 410 includes, but is not limited to, sulfur. Examples of metal surface 405 include, but are not limited to, copper, silver, and gold, which may also be plated by other metals, as stated above.

SAM molecule 400 also includes a terminating group T 415 that is joined to anchoring element A via a carbon chain 435 and terminates the SAM molecule 400. Examples of terminating group T include, but are not limited to, an anchoring element (which may be the same as anchoring element A 410, a functional group, and the like. Anchoring element A serves as one end of SAM molecule 400 and terminating group T serves the other end of SAM molecule 400. Carbon chain 435 represents a number of carbon atoms that are chemically bonded to one another, as well as to terminating group T and anchoring element A. In some embodiments, carbon chain 435 is greater than 10 carbon atoms. A length of carbon chain 435 (e.g., a number of carbon atoms or a distance spanned by the carbon atoms in chain 435) need not be a same length in each SAM molecule 400. SAM molecule 400 also includes three different functional groups, X1 420, X2 425, and X3 430, where each functional group is joined to carbon chain 435 via a carbon chain branch. A length of a carbon chain branch also need not be a same length in each SAM molecule 400. While the illustrated embodiment shows a single molecule of functional groups X1, X2, and X3 included in SAM molecule 400, one or more molecules of each functional group can be included in a single SAM molecule 400.

Each functional group, at least when in the presence of an electromagnetic field (e.g., an electric field or a magnetic field or both), is in a chemical state that carries a charge. An ion on the encapsulant surface is attracted to a functional group having opposite polarity and chemically bonds with the functional group. The chemical bond immobilizes the ion, even after the electromagnetic field is removed. For example, if chloride ions (Cl−) are expected to be present on the encapsulant surface, an anion-capturing functional group such as NH2+ is selected and included in the SAM molecule for capturing chloride ions. The chloride anions bond with molecules of the NH2+ functional group and are immobilized. It is noted that the molecular formulas used herein are empirical formulas representative of the elements included in a functional group, although additional elements or molecules that do not affect the chemical state of the functional group in the presence of an electromagnetic field may also be included in the SAM molecule to bond the functional group to the carbon chain (e.g., intermediate elements may bond the functional group to a carbon chain branch).

In some embodiments, a functional group that is in a neutral chemical state (e.g., carries no charge) is included in a SAM molecule, but changes chemical state upon application of an electromagnetic field (e.g., an electric field, a magnetic field, or both) or voltage to the SAM molecule. The changed chemical state results in the functional group carrying a charge (e.g., positive or negative). For example, NH3 is in a neutral chemical state until a voltage is applied, which oxidizes NH3 to change the chemical state to NH3OH+. Examples of anion-capturing groups include, but are not limited to, amino alkane thiols and hydroxyl alkane thiols. Similarly, a cation-capturing group is selected to capture cations expected to be present on the encapsulant surface. Examples of cation-capturing groups include, but are not limited to, carboxy alkane thiols.

Figure 5:
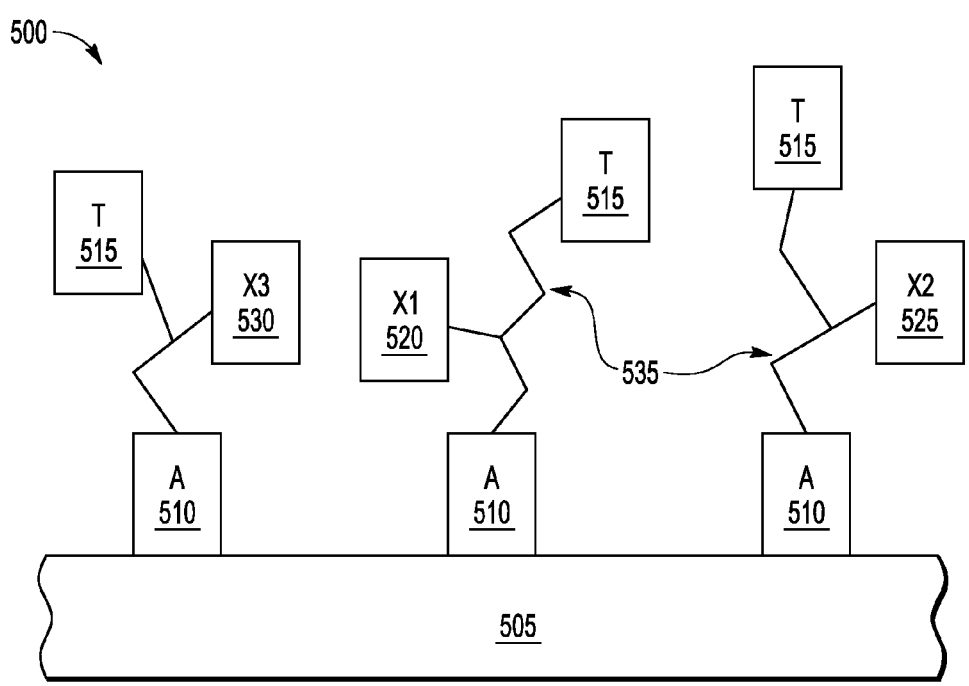

FIG. 5 illustrates a block diagram depicting example molecules of a functionalized self-assembled monolayer (SAM) material 500. In the embodiment illustrated, SAM material 500 includes multiple types of molecule assemblies, where each type of molecular assembly included in SAM material 500 (also referred to as a SAM molecule type) incorporates one or more functional groups. Three SAM molecule types are shown in FIG. 5, although additional SAM molecule types could be included in other embodiments. Each SAM molecule type includes an anchoring element A 510 that is capable of attaching to a metal surface 505. While the illustrated embodiment shows the same anchoring element A included in the SAM molecule types, each SAM molecule type may include a different anchoring element A in other embodiments. Each SAM molecule type also includes a terminating group T 515 that is joined to anchoring element A via a carbon chain 535, as discussed above. While the illustrated embodiment shows the same terminating group T included in the SAM molecule types, each SAM molecule type may include a different terminating group in other embodiments.

In the embodiment shown, each SAM molecule type includes a single functional group selected from the set of three different functional groups, X1 520, X2 525, and X3 530. Each functional group is joined to carbon chain 535 of a respective SAM molecule type via a carbon chain branch. A length of carbon chain 535 or of a carbon chain branch need not be the same length in each of the SAM molecule types. While the illustrated embodiment shows a single molecule of a functional group included in a single SAM molecule type, one or more molecules of the functional group can be included in the single SAM molecule type.

By now it should be appreciated that there has been provided device and method embodiments for a functionalized self-assembled monolayer (SAM) material coating that includes one or more functional groups selected to chemically bond to one or more targeted ions (e.g., cations or anions or both). The functionalized SAM material captures and immobilizes the targeted ions when an electromagnetic field is present, which reduces ionic migration of the metal contacts at the surface of the encapsulant. In this manner, metal growth between metal contacts due to ionic migration is also reduced, which in turn reduces leakage current.

In one embodiment of the present disclosure, a device is provided that includes an integrated circuit (IC) carrier for a semiconductor device; and a coating on the IC carrier, wherein, in the presence of an electrical field or a magnetic field, the coating includes a first functional group that attracts anions and a second functional group that attracts cations.

One aspect of the above embodiment provides that the first functional group includes amino alkane thiols.

Another aspect of the above embodiment provides that the first functional group includes hydroxyl alkane thiols.

Another aspect of the above embodiment provides that the second functional group includes carboxy alkane thiols.

Another aspect of the above embodiment provides that the IC carrier is a package substrate including one of a group consisting of: a leadframe, a quad flat no lead (QFN), a power QFN, a ball grid array, micro leadframe, small outline leadframe, thin small outline, zig-zag inline, single inline package, dual inline package, flatpack, land grid array, pin grid array, plastic leaded chip carrier, chip scale package, flip chip, package on package, and quilt packaging.

Another aspect of the above embodiment provides that the IC carrier is a printed circuit board.

Another aspect of the above embodiment provides that the coating includes an anchoring element.

A further aspect of the above embodiment provides that the anchoring element is sulfur.

Another aspect of the above embodiment provides that the first and second functional groups change their chemical state in the presence of the electrical or magnetic field.

Another aspect of the above embodiment provides that the coating covers a majority of a surface of leads on the IC carrier.

In another embodiment of the present disclosure, a packaged semiconductor device is provided, which includes an integrated circuit (IC) carrier; an integrated circuit (IC) mounted on the IC carrier; a mold compound encapsulating at least a portion of the IC carrier and the IC; and a protective coating on the IC carrier. The protective coating is applied in regions that are subject to electrical or magnetic fields generated by the IC, and the protective coating is formulated with at least two functional groups, where a first functional group of the at least two functional groups immobilizes anions from the mold compound and a second functional group of the at least two functional groups immobilizes cations from the mold compound.

One aspect of the above embodiment provides that the first functional group includes at least one of a group consisting of: amino alkane thiols and hydroxyl alkane thiols.

Another aspect of the above embodiment provides that the second functional group includes carboxy alkane thiols.

Another aspect of the above embodiment provides that the IC carrier is a package substrate including one of a group consisting of: a leadframe, a quad flat no lead (QFN), a power QFN, a ball grid array, micro leadframe, small outline leadframe, thin small outline, zig-zag inline, single inline package, dual inline package, flatpack, land grid array, pin grid array, plastic leaded chip carrier, chip scale package, flip chip, package on package, and quilt packaging.

Another aspect of the above embodiment provides that the IC carrier is a printed circuit board.

Another aspect of the above embodiment provides that the coating includes an anchoring element that includes sulfur.

Another aspect of the above embodiment provides that wherein the first and second functional groups change their chemical state in the presence of the electrical or magnetic field.

In another embodiment of the present disclosure, a method is provided, where the method includes coating an integrated circuit (IC) carrier in a protective compound, where the protective compound includes: a first functional group that is formulated to attract anions from a mold compound in the presence of an electric or magnetic field; and a second functional group that is formulated to attract cations from the mold compound in the presence of the electric or magnetic field.

One aspect of the above embodiment provides that the first functional group includes at least one of a group consisting of: an amino alkane thiol and a hydroxyl alkane thiol and the second functional group includes a carboxy alkane thiol.

Another aspect of the above embodiment provides that the IC carrier is one of a group consisting of: a printed circuit board, a leadframe, a quad flat no lead (QFN), a power QFN, a ball grid array, micro leadframe, small outline leadframe, thin small outline, zig-zag inline, single inline package, dual inline package, flatpack, land grid array, pin grid array, plastic leaded chip carrier, chip scale package, flip chip, package on package, and quilt packaging.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A device comprising:
   an integrated circuit (IC) carrier for a semiconductor device; and
   a coating on the IC carrier, wherein, in the presence of an electrical field or a magnetic field, the coating includes a functionalized self-assembled monolayer (SAM) material that comprises:
   an anchoring element that has an affinity for attachment to a metal surface, a first functional group that carries a positive charge to attract and immobilize anions, and
a second functional group that carries a negative charge to attract and immobilize cations, and
the anions and the cations are ionic contaminants.

2. The device of claim 1 wherein the first functional group includes amino alkane thiols.

3. The device of claim 1 wherein the first functional group includes hydroxyl alkane thiols.

4. The device of claim 1 wherein the second functional group includes carboxy alkane thiols.

5. The device of claim 1 wherein the IC carrier is either a printed circuit board or a package substrate including one of a group consisting of:
a leadframe, a quad flat no lead (QFN), a power QFN, a ball grid array, micro leadframe, small outline leadframe, thin small outline, zig-zag inline, single inline package, dual inline package, flatpack, land grid array, pin grid array, plastic leaded chip carrier, chip scale package, flip chip, package on package, and quilt packaging.

6. The device of claim 1 wherein the anchoring element is sulfur.

7. The device of claim 1 wherein the coating covers a majority of a surface of leads on the IC carrier.

8. A packaged semiconductor device comprising:
an integrated circuit (IC) carrier;
an integrated circuit (IC) mounted on the IC carrier;
a mold compound encapsulating at least a portion of the IC carrier and the IC;
a protective coating on the IC carrier, wherein the protective coating is applied in regions that are subject to electrical or magnetic fields generated by the IC, and the protective coating includes a functionalized self-assembled monolayer (SAM) material that comprises an anchoring element that has an affinity for attachment to a metal surface and at least two functional groups, wherein a first functional group of the at least two functional groups carries a positive charge to attract and immobilize anions from the mold compound, and a second functional group of the at least two functional groups carries a negative charge to attract and immobilize cations from the mold compound, and wherein the anions and the cations are ionic contaminants from the mold compound.

9. The device of claim 8 wherein the first functional group includes at least one of a group consisting of: amino alkane thiols and hydroxyl alkane thiols.

10. The device of claim 8 wherein the second functional group includes carboxy alkane thiols.

11. The device of claim 8 wherein the IC carrier is either a printed circuit board or a package substrate including one of a group consisting of:
a leadframe, a quad flat no lead (QFN), a power QFN, a ball grid array, micro leadframe, small outline leadframe, thin small outline, zig-zag inline, single inline package, dual inline package, flatpack, land grid array, pin grid array, plastic leaded chip carrier, chip scale package, flip chip, package on package, and quilt packaging.

12. The device of claim 8 wherein the anchoring element includes sulfur.

13. The device of claim 1 wherein the first functional group immobilizes the anions by formation of a chemical bond with the anions, and the second functional group immobilizes the cations by formation of a chemical bond with the cations.

14. The device of claim 1 wherein
the first functional group carries the positive charge when the first functional group oxidizes in the presence of the electrical field or the magnetic field to change from a neutral chemical state to a positively charged chemical state,
the first functional group immobilizes the anions by formation of a chemical bond with the anions in the presence of the electrical field or the magnetic field, and
the first functional group is chemically bonded with the anions after removal of the electrical field or the magnetic field.

15. The device of claim 1 wherein
the second functional group carries the negative charge when the second functional group oxidizes in the presence of the electrical field or the magnetic field to change from a neutral chemical state to a negatively charged chemical state,
the second functional group immobilizes the cations by formation of a chemical bond with the cations in the presence of the electrical field of the magnetic field, and
the second functional group is chemically bonded with the cations after removal of the electrical field or the magnetic field.

16. The device of claim 1 wherein the coating includes a functionalized SAM molecule comprising the anchoring element, the first functional group, the second functional group, and a carbon chain that links the first functional group and the second functional group to the anchoring element.

17. The device of claim 1 wherein the coating includes a first functionalized SAM molecule comprising the anchoring element, the first functional group, and a first carbon chain that links the first functional group to the anchoring element, and wherein the coating includes a second functionalized SAM molecule comprising the anchoring element, the second functional group, and a second carbon chain that links the second functional group to the anchoring element.

18. The device of claim 1 wherein the coating comprises a first set of functionalized SAM molecules and a second set of functionalized SAM molecules, wherein the first set of functionalized SAM molecules includes the first functional group that carries the positive charge, and the second set of functionalized SAM molecules includes the first functional group that is chemically bonded to at least one anion.

19. The device of claim 1 wherein the coating comprises a first set of functionalized SAM molecules and a second set of functionalized SAM molecules, wherein the first set of functionalized SAM molecules includes the second functional group that carries the negative charge, and the second set of functionalized SAM molecules includes the second functional group that is chemically bonded to at least one cation.

20. The device of claim 8 wherein
the IC carrier comprises a plurality of metal contacts,
a surface of the mold compound and the plurality of metal contacts are exposed to an ambient environment,
the cations and the anions migrate along the surface of the mold compound toward the metal contacts in the presence of moisture in the ambient environment, and
the cations and the anions are immobilized by the protective coating on a surface of the metal contacts adjacent to the surface of the mold compound.

* * * * *